United States Patent [19]

Yokoyama

[11] Patent Number: 5,200,349
[45] Date of Patent: Apr. 6, 1993

[54] SEMICONDUCTOR DEVICE INCLUDING SCHOTKY GATE OF SILICIDE AND METHOD FOR THE MANUFACTURE OF THE SAME

[75] Inventor: Naoki Yokoyama, Yokohama, Japan
[73] Assignee: Fujitsu Limited, Kawasaki, Japan
[21] Appl. No.: 223,699
[22] Filed: Jul. 25, 1988

Related U.S. Application Data

[63] Continuation of Ser. No. 755,452, Aug. 16, 1985, abandoned, which is a continuation of Ser. No. 721,144, Apr. 10, 1985, Pat. No. 4,566,021, which is a continuation of Ser. No. 334,923, Dec. 28, 1981, abandoned.

[30] Foreign Application Priority Data

Dec. 30, 1980 [JP] Japan ............... 55-189544

[51] Int. Cl.$^5$ ............................ H01L 21/338
[52] U.S. Cl. ........................ 437/41; 437/178; 437/200; 437/912
[58] Field of Search ............. 437/200, 176, 177, 178, 437/179, 41

[56] References Cited

U.S. PATENT DOCUMENTS

| | | | |
|---|---|---|---|
| 3,906,470 | 9/1975 | Hollins | 357/15 |
| 4,141,022 | 2/1979 | Sigg et al. | 357/23 |
| 4,154,625 | 5/1979 | Golovchenko et al. | 437/19 |
| 4,180,596 | 12/1979 | Crowder et al. | 357/71 |
| 4,214,256 | 7/1980 | Dalal et al. | 357/71 |
| 4,254,428 | 3/1981 | Feth et al. | 357/15 |
| 4,325,181 | 4/1982 | Yoder | 437/178 |
| 4,330,343 | 5/1982 | Christou et al. | 357/71 |
| 4,338,616 | 7/1982 | Bol | 357/15 |
| 4,373,251 | 2/1983 | Wilting | 437/179 |

FOREIGN PATENT DOCUMENTS

| | | | |
|---|---|---|---|
| 0113372 | 9/1980 | Japan | 357/15 A |
| 0055074 | 5/1981 | Japan | 357/15 |

OTHER PUBLICATIONS

Das, M., et al., *IEEE Trans. Elec. Services*, Jun. 1977, pp. 757–761.
Sharma, B. L., et al., *Solid State Technology*, May 1980, pp. 97–101.
Murarka, S. P., *Silicides for VCSI Applications* Academic Press, 2983, pp. 14–23.
Sharma, B. L., Metal–Semiconductor Schottky Barrier ... Prenum Press, 1984, pp. 12–17.
Sze, C. M., Physics of Semiconductor Services, John Wiley & Sons, Second Edition, 1981, pp. 245–273.
"Effect of Alloying Behavior on the Electrical Characteristics of n–GaAs Schottky Diodes Metallized with W, Au, and Pt", by Sinha et al., pp. 666–668.
Sinha, A. K., et al., *Appl. Phys. Lett.*, vol. 23, No. 12, 15 Dec. 1973, pp. 666–669.
Yokoyama, N., et al., *IEEE IEDM Tech. Digest*, 1981, pp. 80–83.
Huatek, E. R., *A User's Handbook of Integrated Circuits*, John Wiley & Sons, 1973, pp. 66–67.
Murarka, S. P., *J. Vac. Sci. Technol.*, vol. 17, No. 4, Jul.–Aug. 1980, pp. 775–792.

Primary Examiner—Tuan N. Quach
Attorney, Agent, or Firm—Staas & Halsey

[57] ABSTRACT

A Schottky gate electrode of a refractory metal silicide is formed on a compound semiconductor, by which the barrier height is maintained satisfactorily even after heat treatment above 800° C. Accordingly, it is possible to form an impurity diffused region using the Schottky gate electrode as a mask and then to effect the recrystallization of the semiconductor or the activation of the impurity by heat treatment, so that source and drain regions can be positioned by self-alignment relative to the gate electrode.

21 Claims, 11 Drawing Sheets

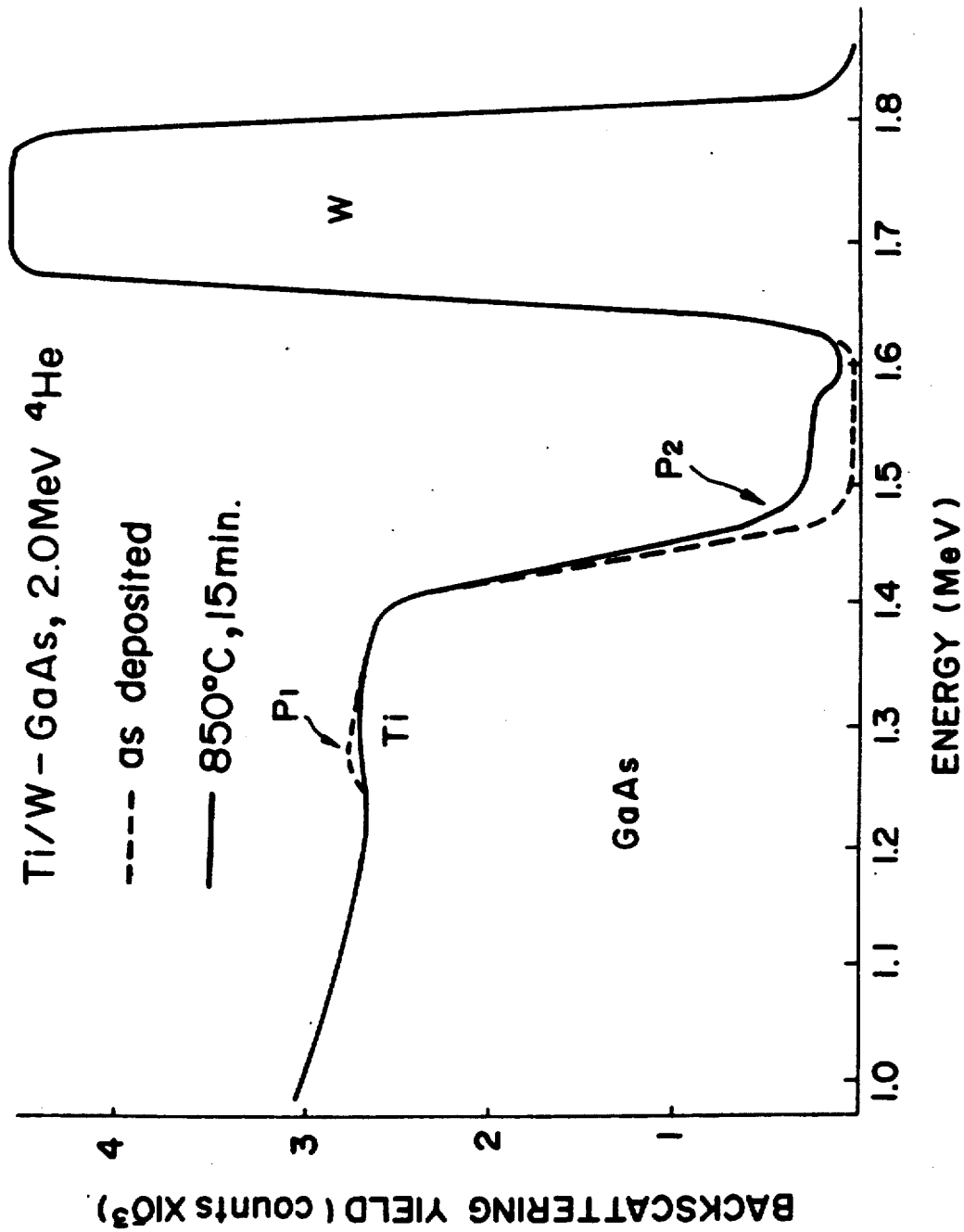

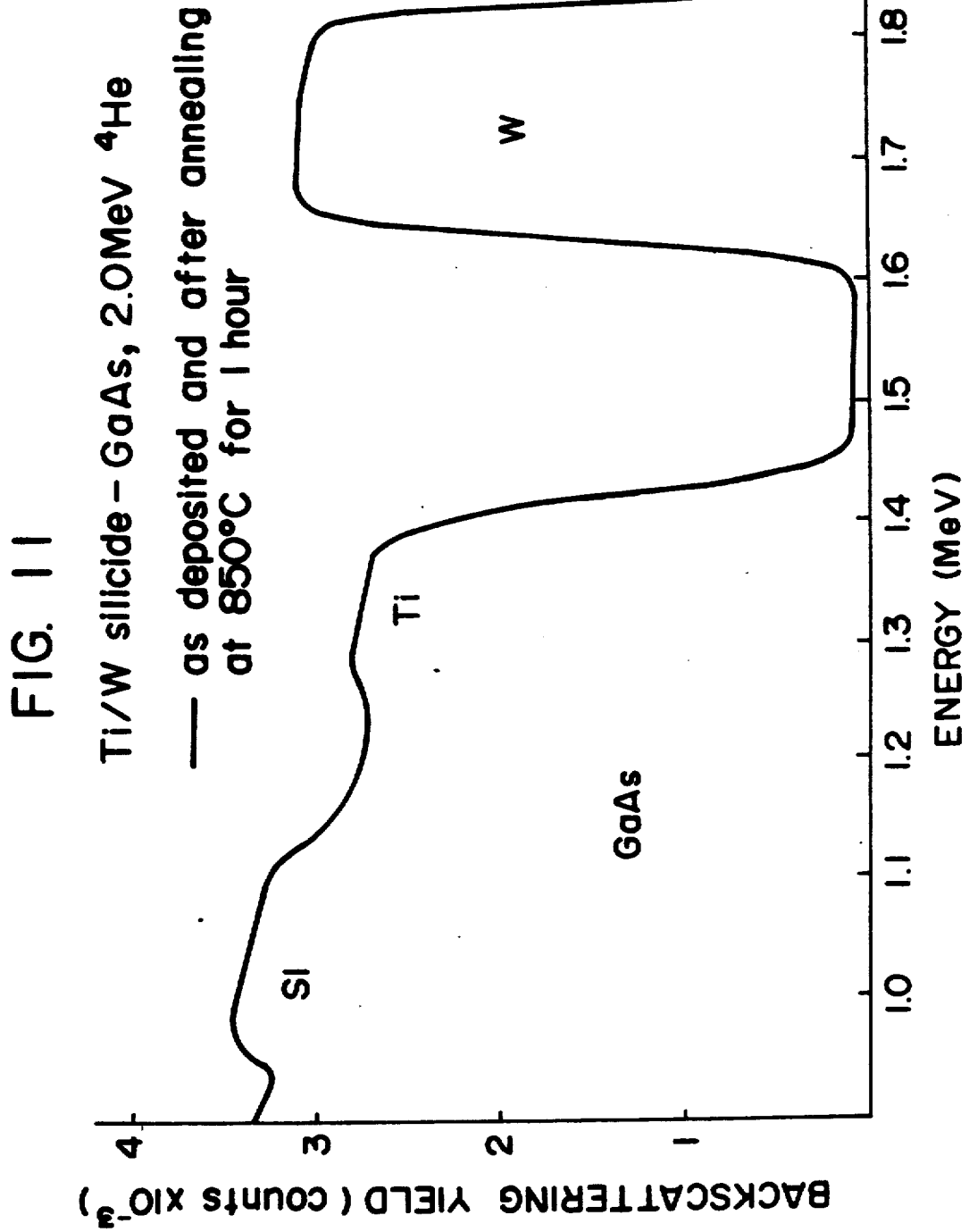

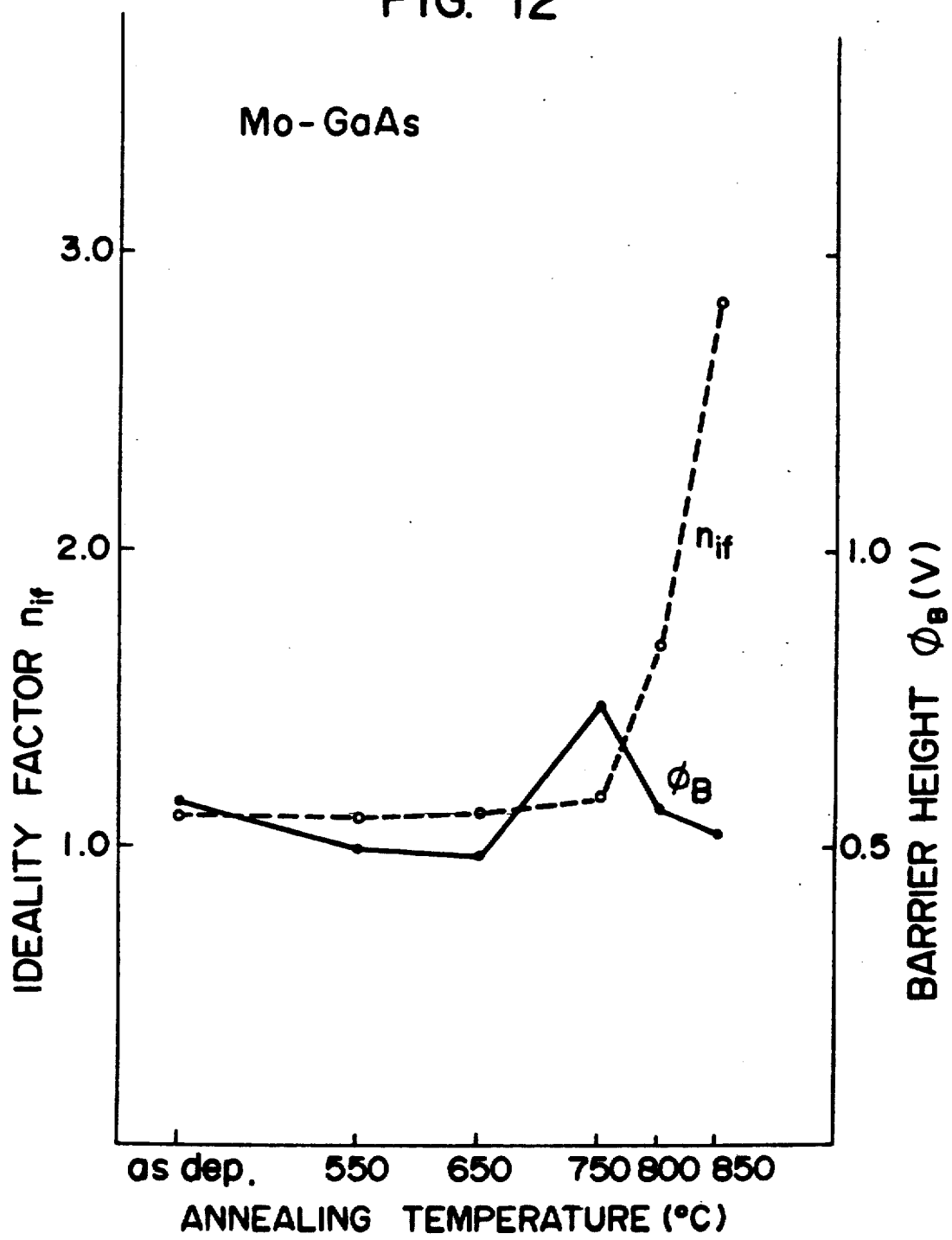

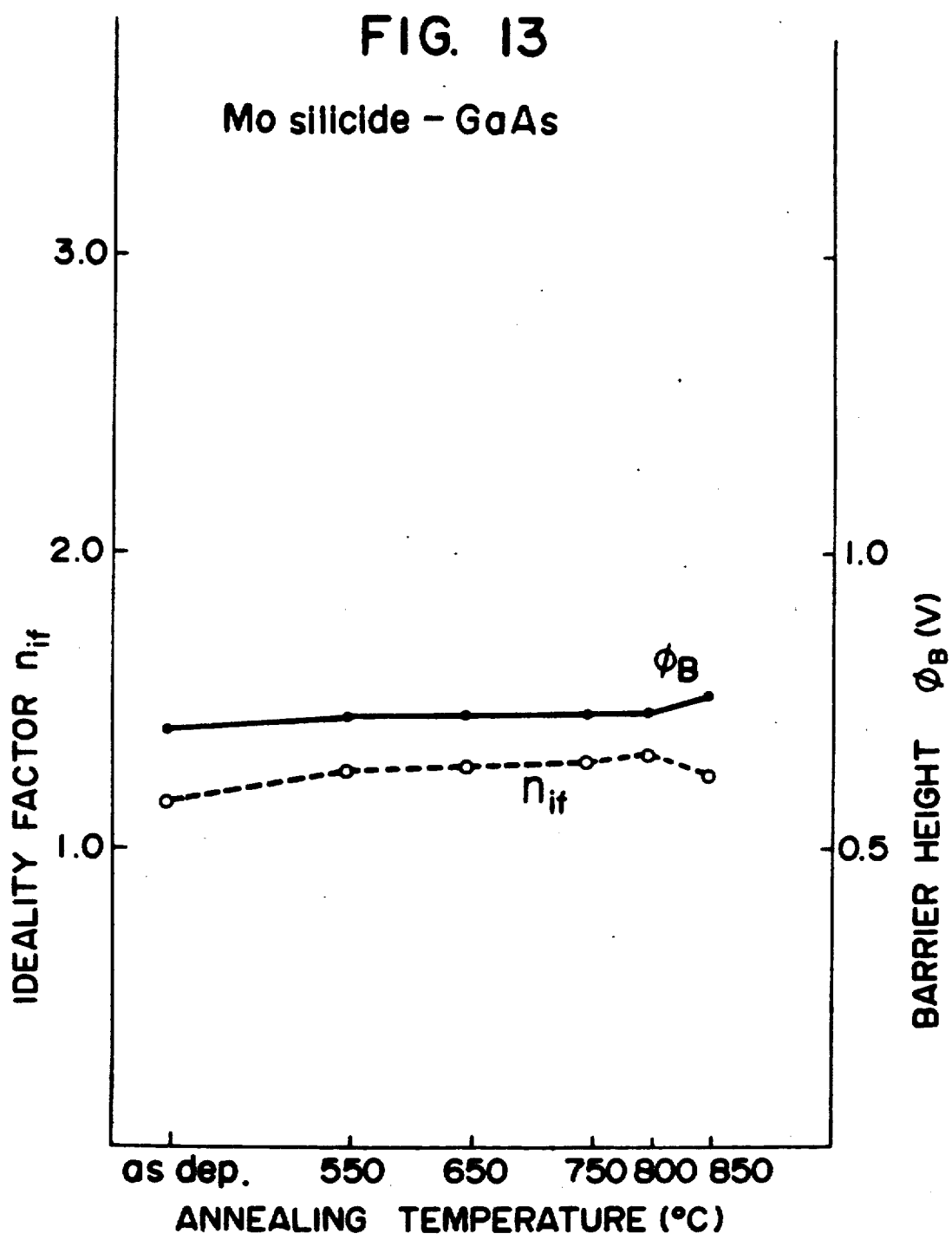

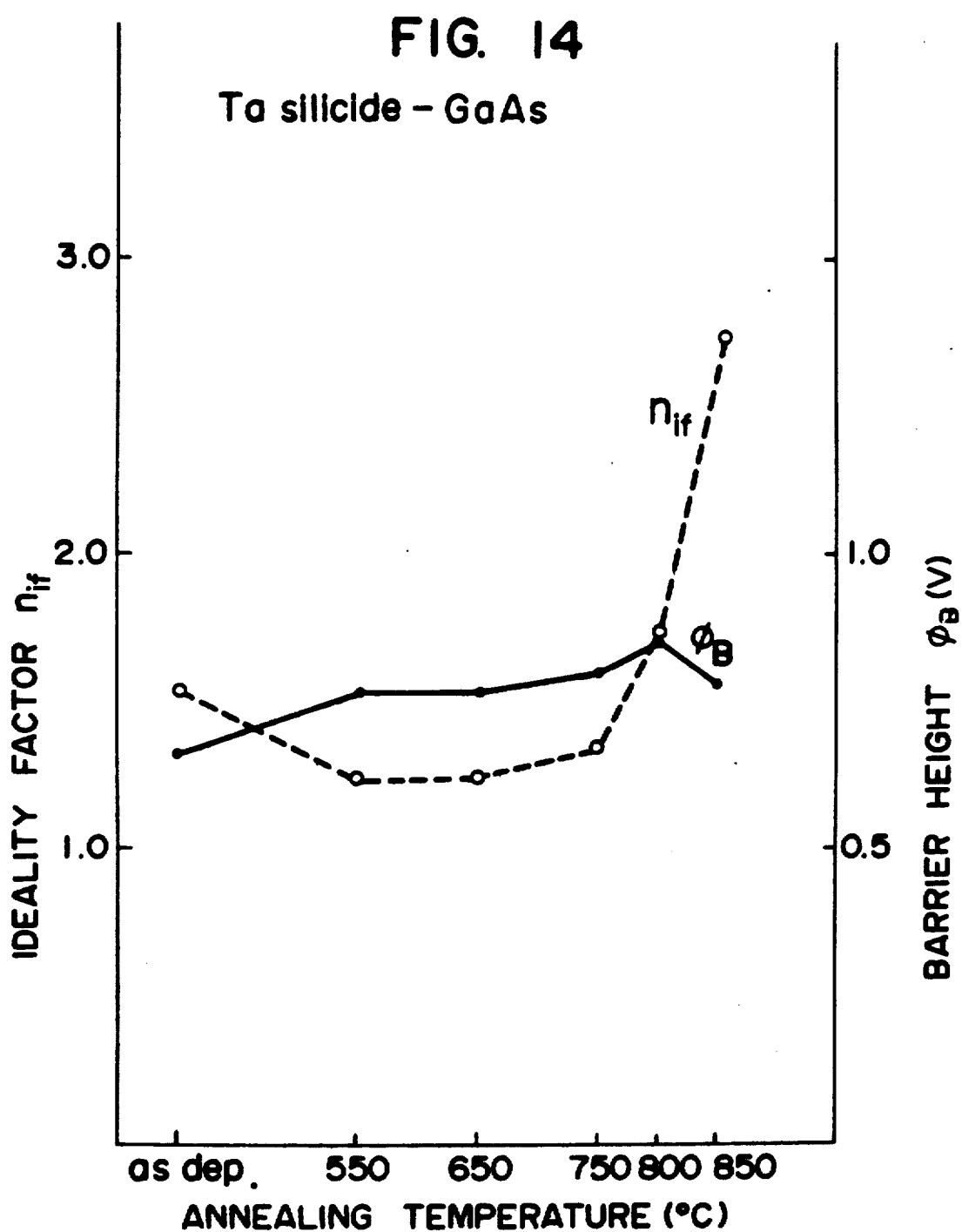

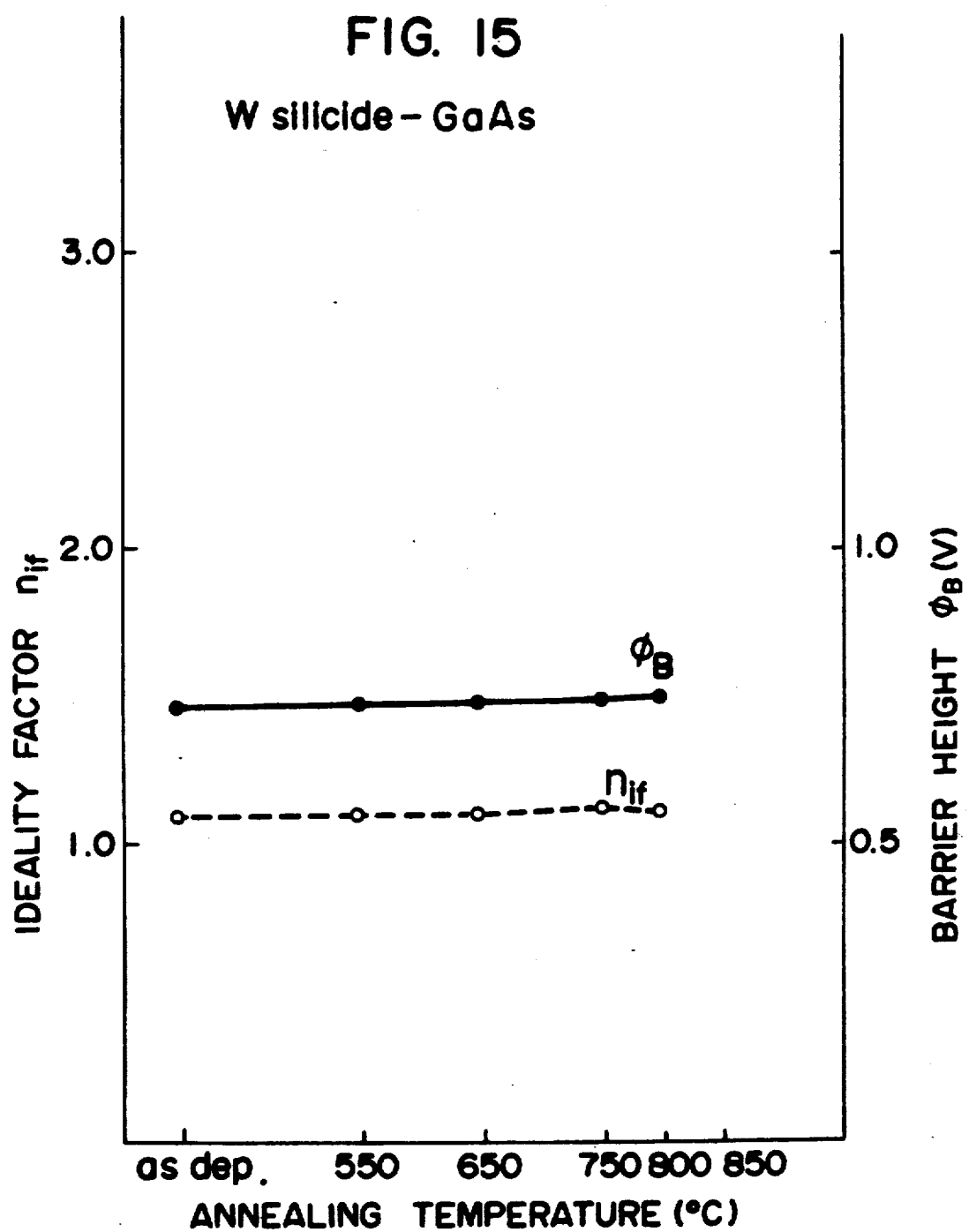

SEMICONDUCTOR DEVICE INCLUDING SCHOTKY GATE OF SILICIDE AND METHOD FOR THE MANUFACTURE OF THE SAME

This is a continuation of co-pending application Ser. No. 755,452 filed on Aug. 16, 1985 now abandoned, which is a continuation of U.S. application Ser. No. 721,144, filed Apr. 10, 1985, now U.S. Pat. No. 4,566,021, issued Jan. 21, 1986; which is a continuation of U.S. application Ser. No. 334,923, filed Dec. 28, 1981 now abandoned.

BACKGROUND OF THE INVENTION

The present invention relates to a semiconductor device using a compound semiconductor, such as a Schottky gate field effect transistor, and a method for the manufacture of the same.

Heretofore, metals such as aluminum(Al), gold(Au), titanium(Ti), molybdenum(Mo), tungsten(W), tantalum(Ta) and so forth have been employed, for example, for a gate electrode of GaAs Schottky gate field effect transistors. With any of these metals, however, when it is heat-treated at about 600° C., the electrical properties of the gate electrode, such as, for example, the barrier height, the ideality factor and the reverse breakdown voltage are degraded, making the transistor operation impossible.

As a solution to this problem, it has recently been proposed to use a Ti/W alloy for the gate electrode.

But this alloy also cannot withstand, for example, an 800° C. heat treatment, which results in a loss or degradation of the barrier to make the operation unstable. In addition to this, if an ordinary manufacturing process is adopted, the gate electrode may sometimes be corroded which increases its resistivity or causes it to flake off.

SUMMARY OF THE INVENTION

It is an object of the present invention to provide a semiconductor device, such as a field effect transistor, in which a Schottky gate electrode arranged on a compound semiconductor is formed of a silicide of a refractory metal and which is capable of enduring heat treatment up to above 800° C.

According to the present invention, an impurity can be introduced to form regions by the so-called self-alignment method using the gate electrode as a mask, that is, source and drain regions can be positioned relative to the gate electrode through self-alignment.

BRIEF DESCRIPTION OF THE DRAWINGS

FIGS. 10 and 11 are graphs showing the results of Rutherford backscattering measurement;

FIGS. 12 to 15 are graphs showing the relationships of the barrier height $\phi_B$ and the ideality factor $n_f$ to the annealing temperature.

DESCRIPTION OF THE PREFERRED EMBODIMENTS

Figure 1:
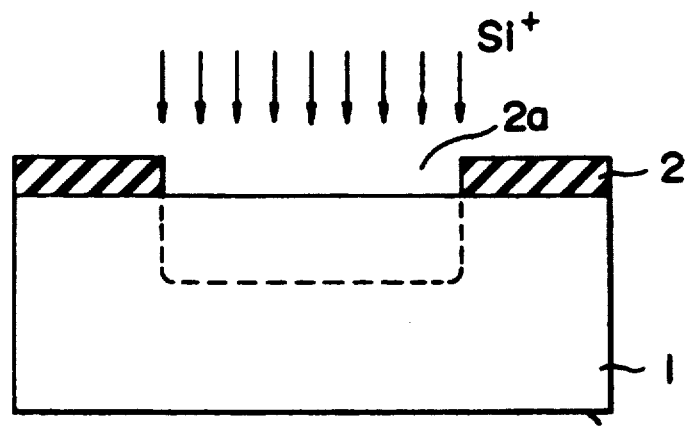
FIGS. 1 to 6 schematically show, in section, a sequence of steps involved in the manufacture of a semiconductor device according to an embodiment of the present invention.
Figure 2:
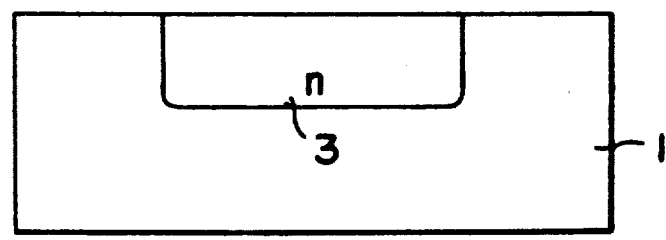
Figure 3:
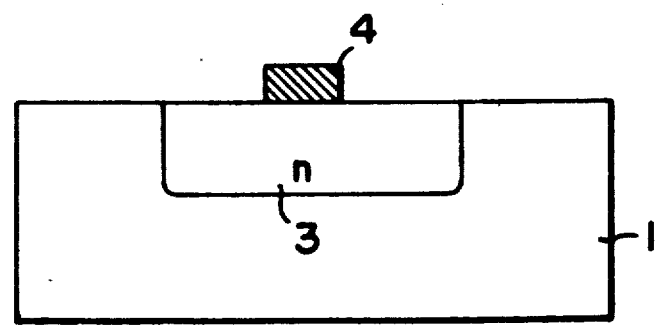
Figure 4:
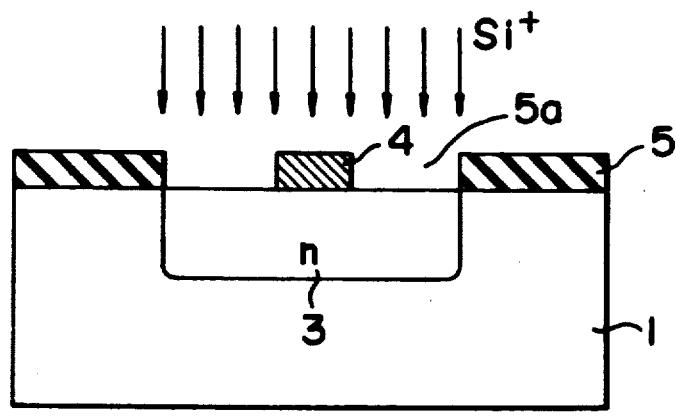
Figure 5:
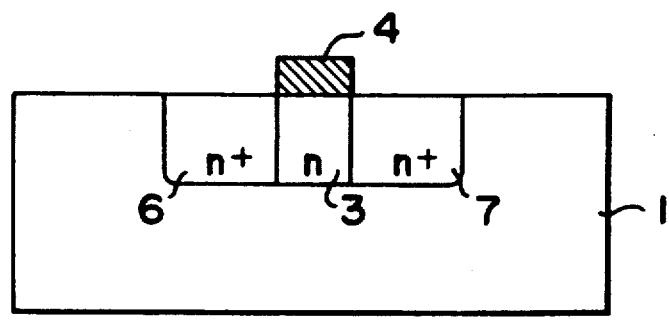
Figure 6:
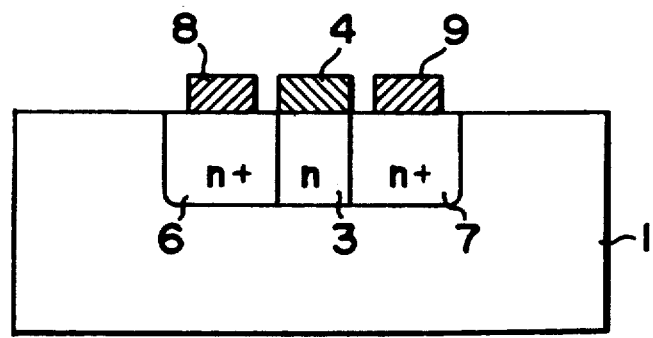

A Schottky contact as described herein includes contacts in which an electrode makes direct contact with a semiconductor substrate to provide rectifying characteristics, in which the electrode makes direct contact and causes alloying or sintering therebetween to yield the rectifying characteristics, or in which the electrode metal is disposed on the semiconductor substrate through an insulating film such as a natural oxide film on the substrate surface so that the rectifying characteristics are developed by a tunnel phenomenon (a tunnel current) in the insulating film.

A description will be given, with reference to FIGS. 1 to 6, of the manufacture of a semiconductor device in accordance with an embodiment of the present invention.

FIG. 1:

(1) A silicon dioxide film 2 is formed, for example, 6000 Å thick, on a GaAs semi-insulating substrate 1 doped with chromium and subjected to patterning by a known method to form a window 2a.

(2) Silicon is implanted into the substrate 1 through the window 2a by means of ion implantation with an accelerating energy of 175 KeV and a dose of $2.6 \times 10^{12}$ cm$^{-2}$, while using the silicon dioxide film 2 as a mask.

FIG. 2:

(3) After removing the remaining silicon dioxide film 2, a silicon dioxide film is newly formed to a thickness of, for example, approximately 1000 Å, and the substrate assembly is heat-treated at a temperature of, for instance, 850° C., for a certain period of time, for example, 15 minutes, thereby to obtain an n type layer 3 as shown. The newly formed silicon dioxide film is for preventing out-diffusion, and is removed after the heat treatment.

The n type layer 3 may also be formed by an epitaxial growth method on the semiconductor substrate 1 instead of such a selective ion implantation method as described above.

FIG. 3:

(4) A Ti/W silicide alloy of such a composition, for example, as $(Ti_{0.3}W_{0.7})Si_2$ is deposited by sputtering to form an alloy film, for example, 6000 Å thick and the film is subjected to patterning by dry etching using an etchant composed of $CF_4 + O_2$ (5%) and a silicon dioxide film as a mask (not shown). Thus a gate electrode 4 is formed.

FIG. 4:

(5) A silicon dioxide film 5 is formed and selectively removed by patterning to provide a window 5a exposing the surface of the n type layer 3.

(6) Silicon is implanted into the n type layer 3 through the window 5a by an ion implantation method with an accelerating energy of 175 KeV and a dose of $1.7 \times 10^{13}$ cm$^{-2}$, while using the gate electrode 4 and the silicon dioxide film 5 as a mask.

FIG. 5:

(7) After removing the remaining silicon dioxide film 5, a silicon dioxide film is newly formed, for example, with a thickness of about 1000 Å, and the substrate assembly is heat-treated, for example, at 800° C., for 15 minutes or so, thereby forming n+ type regions 6 and 7 as shown. The newly formed silicon dioxide film is removed after the heat treatment.

The impurity concentration in each of the n+ type regions 6 and 7 thus formed is $1\times10^{18}$ cm$^{-3}$ at its peak and the impurity concentration in the n type layer 3 is $1\times10^{17}$ cm$^{-3}$ similarly at its peak.

FIG. 6:

(8) Electrodes 8 and 9 are formed by known techniques on the n+ type regions 6 and 7, respectively. The electrodes 8 and 9 may be formed of the AuGe/Au series. Either one of the electrodes 8 and 9 is used as the source electrode and the other as the drain electrode.

Incidentally, if a leak current of the gate tends to increase, then the surface of the GaAs portion is etched away by about 100 Å prior to the formation of the electrodes 8 and 9. The etchant therefor may be $KOH+H_2O_2$.

Figure 7:
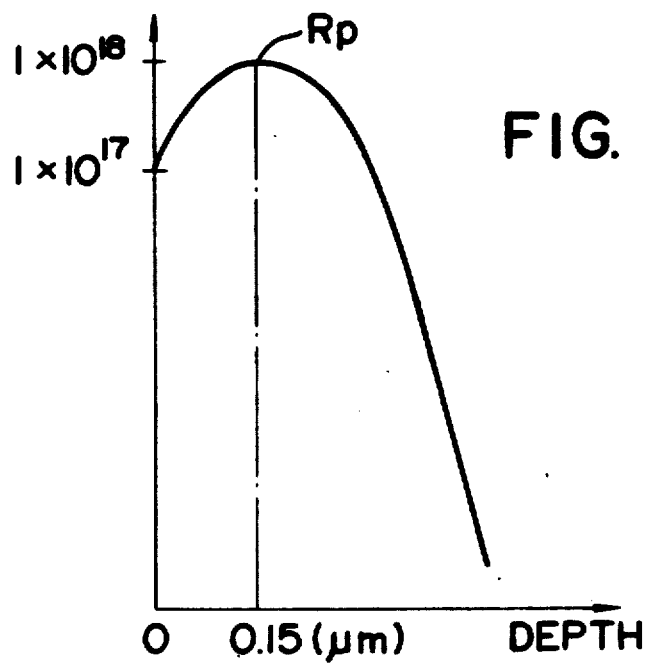
FIG. 7 is a graph showing the impurity concentration distribution in an impurity diffused region.

Performance data of the field effect transistor thus manufactured are as follows:

Gate length: 1.4 μm
Gate width: 200 μm
Source-drain spacing: 6 μm
gm: 23 mʊ
Cgs (capacitance between source and gate): 0.30 pF
$f_T$ (cutoff frequency): 12.3 GHz
Schottky gate
$n_{if}$ (ideality factor): 1.18
Barrier height $\phi_B$: 0.78 V
Breakdown voltage: 6.0 V Since the n+ type regions 6 and 7 are formed by self-alignment using the gate electrode 4 as a mask, a short therebetween may generally be feared, but this is avoided in the present invention. That is, in the n+ type regions 6 and 7 formed by the method described above, the impurity concentration distribution is a Gaussion distribution as shown in FIG. 7. The peak depth ($R_p$) of the distribution is, for example, 0.15 μm, and if the impurity concentration at the peak is $1\times10^{18}$ cm$^{-3}$, then the impurity concentration at the surface is approximately $1\times10^{17}$ cm$^{-3}$, which provides a breakdown voltage of higher than 5 V.

For maintaining the reverse breakdown voltage of the Schottky gate electrode, the following steps can be taken:

1) the dose of the impurity for the n+ type regions 6 and 7 is reduced;
2) after the formation of the n+ type regions 6 and 7, the Schottky gate electrode 4 is made thin by etching;
3) the Schottky gate electrode 4 is insulated;
4) the surfaces of the n+ type regions 6 and 7 are etched;
5) prior to the formation of the n+ type regions 6 and 7, the Schottky gate electrode 4 to be used as a mask is worked into an umbrella-like shape, or an umbrella-shaped mask is provided separately before the ion implantation; or
6) the energy for the ion implantation is raised to increase the peak depth Rp (in the foregoing embodiment).

In the present invention the method 6 is basically employed but may also be combined with any of the other methods mentioned above, as required. Data on the Schottky withstand voltage for the GaAs n+ type region are as follows:

| Concentration in flat layer or peak concentration in ion-implanted layer | n+ type flat layer by epitaxial growth or the like | Si-ion-implanted n+ type layer with Gaussian distribution | |
|---|---|---|---|
| | | E: 175 Kev $R_p$: 0.150μ | E: 350 Kev $R_p$: 0.306μ |
| $2\times10^{18}$ cm$^{-3}$ | 0.85 V | 3.65 V | 7.77 V |
| $1\times10^{18}$ cm$^{-3}$ | 1.69 V | 6.0 V | 10.2 V |
| $5\times10^{17}$ cm$^{-3}$ | 3.39 V | 8.30 V | 13.3 V |

The present invention involves the use of the refractory metal silicide as the electrode material 50 that the Schottky gate electrode can be positioned by self-alignment, that is, the formation of the Schottky gate electrode can be followed by heat treatment for activation of the implanted ions. The following table shows a comparison of Ti/W and Ti/W silicide alloys.

| | TiW (Ti:10 wt %) | $Ti_xW_{1-x}Si_2$ (Ti:10 wt %) |
|---|---|---|
| Resistivity (after heat treatment at 850° C. for 15 minutes) | $2\sim3\times10^4$ Ω·cm | $0.8\sim1\times10^{-4}$ Ω·cm |
| corrosion rate by HF (conc) | 1 μm/minute | 0 |
| corrosion rate by $NH_4F$:HF = 10:1 | 1200 Å/minute | 0 |
| Stability of Schottky junction after heat treatment at 800° C. for 15 minutes | about 50% degraded. Unstable | about 100%, stable Schottky characteristics Barrier height: 0.78 V $n_{if}$:1.18 |

Figure 8:
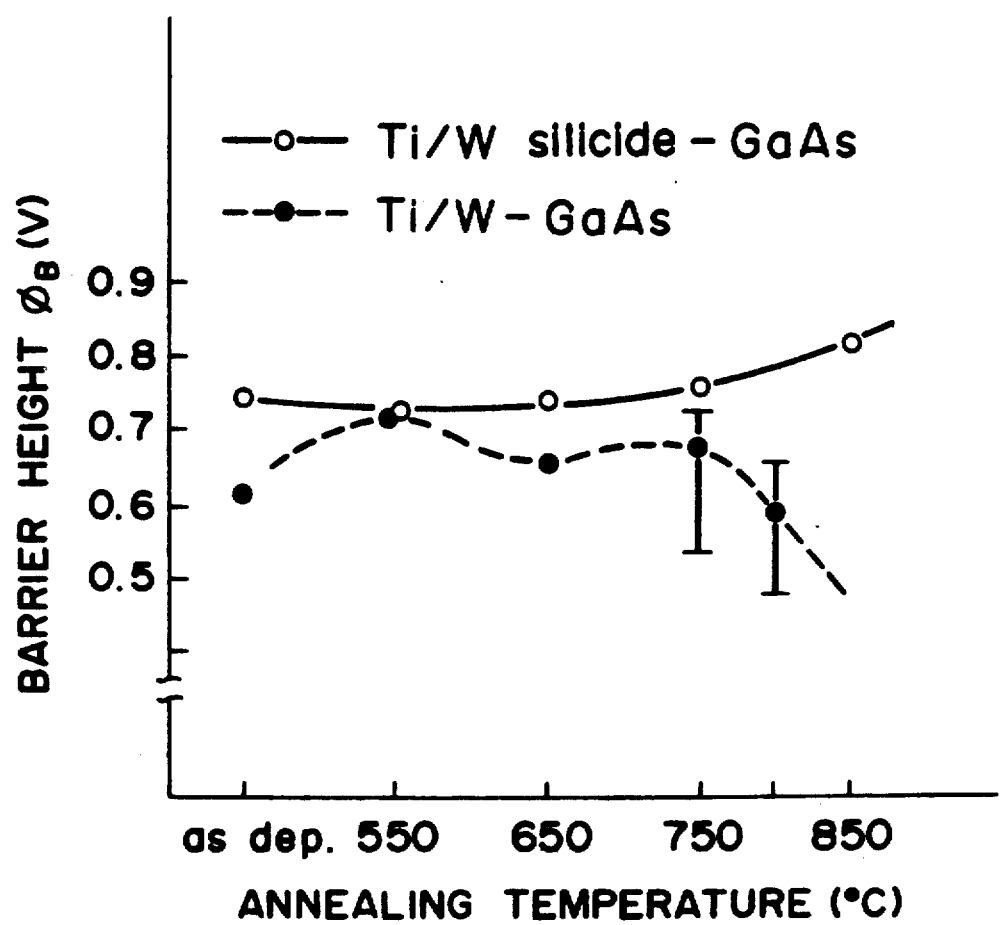
FIG. 8 is a graph showing the relation between the barrier height $\phi_B$ and the annealing temperature.

FIG. 8 is a graph showing the relationship between the barrier height $\phi_B$ and the annealing temperature, wherein the ordinate represents the barrier height $\phi_B$ (V) and the abscissa the annealing temperature (° C.). In FIG. 8, the solid line shows the characteristics of the Ti/W silicide alloy and the broken line the characteristics of the Ti/W alloy.

As will be seen from FIG. 8, the barrier height in the case of the Ti/W silicide alloy is more stable against heat treatment than in the case of the Ti/W alloy.

Figure 9:
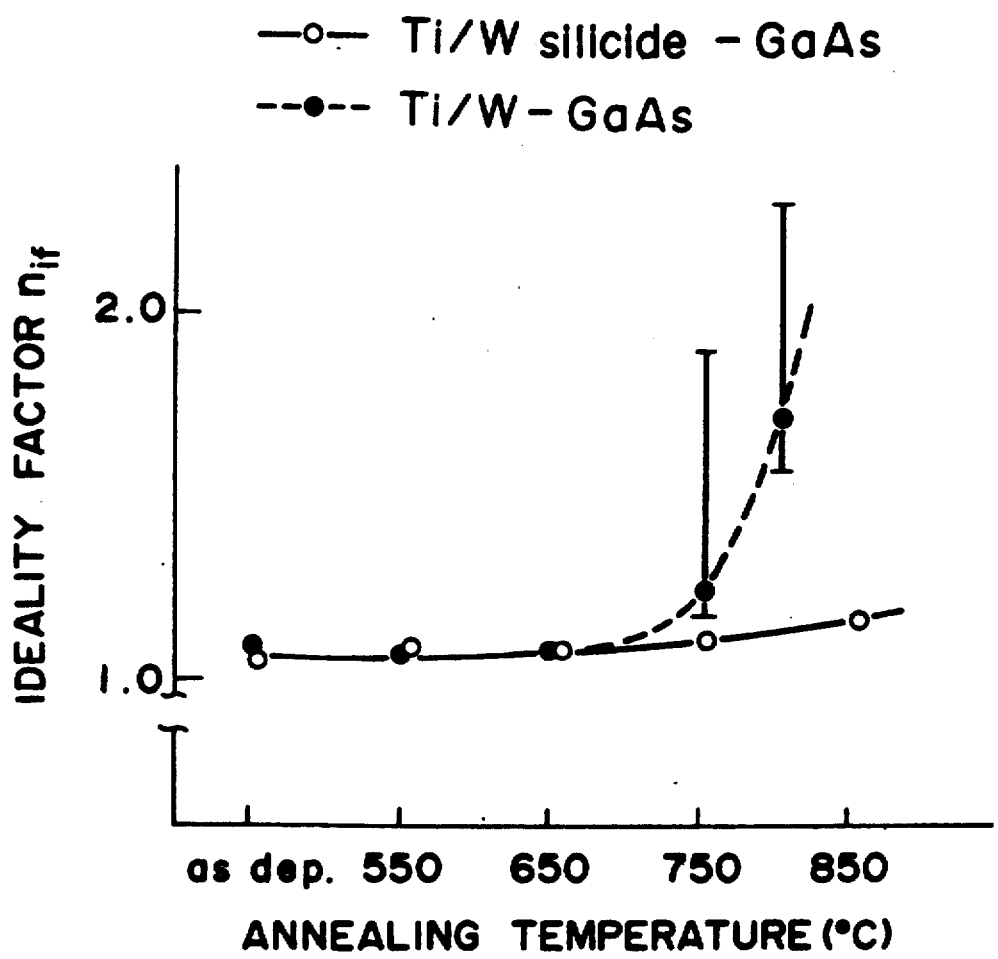
FIG. 9 is a graph showing the relation between the ideality factor $n_f$ and the annealing temperature.

FIG. 9 is a graph showing the relationship between the ideality factor $n_{if}$ and the annealing temperature, wherein the ordinate represents the ideality factor $n_{if}$ and the abscissa the annealing temperature (° C.). The solid line indicates the characteristics of the Ti/W silicide alloy and the broken line the characteristics of the Ti/W alloy.

As will be understood from FIG. 9, the ideality factor $n_{if}$ of the Ti/W silicide alloy slightly increases with the annealing temperature but this increase is so negligibly small that the ideality factor $n_{if}$ can be regarded as almost constant as compared with the ideality factor $n_{if}$ of the Ti/W alloy.

FIGS. 10 and 11 are graphs showing the results of examination of reaction between substances as studied by a back-scattering method using $^4$He with an accelerating energy of 2.0 MeV, wherein the ordinate represents the count of backscattered $^4$He and the abscissa the energy of backscattered $^4$He.

FIG. 10 indicates the case of the Ti/W alloy being used, wherein the solid line shows the spectrum obtained in the case where the deposited Ti/W alloy was, held as it was and the broken line shows the spectrum obtained after annealing in a hydrogen ($H_2$) atmosphere at 850° C. for 15 minutes.

It must be noted here that titanium moved into the GaAs after annealing as seen from the portion indicated by the arrow $P_1$, and that, after annealing, a signal appeared in an originally signal-free section (of 1.5 to 1.6 MeV energy) as indicated by the arrow $P_2$. This indicates that GaAs moved towards the surface (corresponding to the right-hand side of FIG. 10).

FIG. 11 shows the case of the Ti/W silicide alloy being used. There is no difference in the spectrums of the case of the Ti/W deposited silicide alloy being held as it was and the case of the alloy being annealed in a hydrogen ($H_2$) atmosphere at 850° C. for an hour.

The following tables show measured values of the barrier height $\phi_B$ and the ideality factor $n_{if}$ of Schottky electrodes formed of other refractory metals of molybdenum, tantalum and tungsten and their silicides.

|  |  | as deposited | 550° C. | 650° C. | 750° C. | 800° C. | 850° C. |
|---|---|---|---|---|---|---|---|
| Mo | $\phi_B$ | 0.583 ± 0.044V | 0.506 ± 0.001V | 0.489 ± 0.008V | 0.747 ± 0.003V | 0.573 ± 0.016V | 0.532 ± 0.021V |
|  | $n_{if}$ | 1.15 ± 0.01 | 1.10 ± 0.01 | 1.11 ± 0.01 | 1.17 ± 0.01 | 1.68 ± 0.10 | 2.84 ± 0.63 |
| MoSi | $\phi_B$ | 0.704 ± 0.003V | 0.720 ± 0.002V | 0.725 ± 0.007V | 0.725 ± 0.004V | 0.729 ± 0.004V | 0.753 ± 0.005V |
|  | $n_{if}$ | 1.16 ± 0.01 | 1.23 ± 0.01 | 1.24 ± 0.02 | 1.29 ± 0.03 | 1.31 ± 0.03 | 1.25 ± 0.03 |
| Ta | $\phi_B$ | 0.665 ± 0.002V | — | — | — | — | — |
|  | $n_{if}$ | 1.19 ± 0.01 | — | — | — | — | — |
| TaSi | $\phi_B$ | 0.632 ± 0.018V | 0.741 ± 0.003V | 0.746 ± 0.002V | 0.782 ± 0.006V | 0.837 ± 0.028V | 0.766 ± 0.014V |
|  | $n_{if}$ | 1.47 ± 0.18 | 1.18 ± 0.01 | 1.20 ± 0.01 | 1.31 ± 0.01 | 1.69 ± 0.23 | 2.73 ± 0.20 |
| W | $\phi_B$ | 0.71 ± 0.01V | — | — | — | — | — |
|  | $n_{if}$ | 1.08 ± 0.01 | — | — | — | — | — |
| WSi | $\phi_B$ | 0.730 ± 0.005V |  | 0.75 ± 0.01V | 0.75 ± 0.2V | 0.76 ± 0.02V |  |
|  | $n_{if}$ | 1.09 ± 0.01 |  | 1.12 ± 0.02 | 1.14 ± 0.04 | 1.12 ± 0.02 |  |

The above shows that the silicide is very stable against heat treatment in any case. The reason for which no data is given for tantalum at temperatures above 550° C. is that the tantalum film, when heated up to such high temperatures, flakes off the GaAs substrate, owing to its coefficient of expansion. Further, in the case of tungsten, the rectifying characteristics are lost at such temperatures.

FIGS. 12 to 15 are graphical representations of the data given in the above tables. The left-hand ordinate represents the ideality factor $n_{if}$, the right-hand ordinate the barrier height $\phi_B$ and the abscissa the annealing temperature, the solid line showing the barrier height $\phi_B$ and the broken line the ideality factor $n_{if}$. FIG. 12 shows the case of molybdenum, FIG. 13 the case of MoSi, FIG. 14 the case of TaSi and FIG. 15 the case of WSi. As regards tantalum and tungsten, alone on the substrate no data are obtainable as explained above, and hence graphical showings are meaningless.

As will be appreciated from the data given above, even if the refractory metal silicide according to the present invention is subjected to high temperature heat treatment, for example, for the activation of implanted ions, the Schottky contact is retained between the ion-implanted region and a semiconductor layer.

Figure 16:
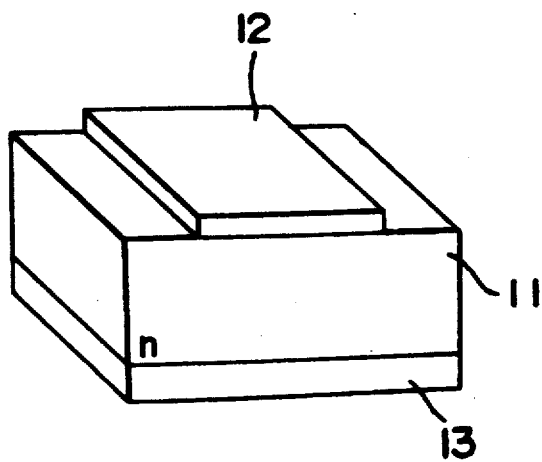
FIG. 16 is a perspective view illustrating the principal part of a model of a semiconductor device employed for obtaining various data.

FIG. 16 is a perspective view showing a model used for obtaining the above data. In FIG. 16, reference numeral 11 indicates a GaAs substrate having a carrier concentration of about $2 \times 10^{17}$ cm$^{-3}$; 12 designates a Schottky gate electrode measuring $100 \times 150$ $\mu$m and 2000 Å thick; and 13 identifies an electrode formed of AuGe/Au, the thicknesses of the AuGe and Au layers being 200 Å and 2000 Å, respectively. The electrode 13 was heat-treated at 450° C. for 2 minutes.

For obtaining the barrier height $\phi_B$ and the ideality factor $n_{if}$ from this model, the I-V characteristic is measured applying a voltage across the electrode 12 and 13.

It has not yet been satisfactorily clarified why the Schottky gate electrode formed of a refractory metal silicide on a compound semiconductor withstands well heat treatment temperatures higher than 850° C., but one of the reasons may be considered to reside in that the silicide does not readily react with the compound semiconductor.

As has been described in the foregoing, according to the present invention, by using the refractory metal silicide for the Schottky gate electrode, the positioning of source and drain regions can be effected by self-alignment relative to the gate electrode. Accordingly, the present invention permits miniaturization of semiconductor devices employing the Schottky gate electrode, and hence it is of great utility when employed for fabrication of a semiconductor integrated circuit using a plurality of such semiconductor devices. Furthermore, the gate electrode structure according to the present invention can also be employed as a gate electrode of a high electron mobility transistor (HEMT).

In present invention, the composition of the alloyed film is not limited specifically to a stoichiometric alloy composition, but may also be different from a stoichiometric value.

It will be apparent that many modifications and variations may be effected without departing from the scope of the novel concepts of this invention.

What is claimed is:

1. A method for the manufacture of a semiconductor device, comprising the steps of:

forming a Schottky gate electrode of a refractory metal silicide including silicide of at least one of Mo and W on a compound semiconductor substrate, the Schottky gate electrode having a barrier height and an ideality factor which are stable with respect to heat treatment at temperatures up to substantially 850° C.;

forming regions by introducing an impurity into the compound semiconductor substrate using the Schottky gate electrode as a mask; and subsequently heat treating the semiconductor substrate and the Schottky gate electrode by heating the semiconductor substrate and the Schottky gate electrode to a temperature in the range from substantially 650° C. to substantially 850° C.

2. A method for manufacturing a semiconductor device comprising the steps of:

forming a Schottky gate electrode of refractory metal silicide including silicide of at least one of Mo and W on a compound semiconductor substrate;

introducing an impurity into the compound semiconductor substrate by an ion implantation using the Schottky gate electrode as a mask; and subsequently heat treating said substrate and said electrode by heating said substrate and said electrode to a temperature in the range from substantially 650° C. to substantially 850° C.;
wherein said device is formed to have characteristics corresponding to at least one of a barrier height and an ideality factor with respect to said Schottky gate electrode that is stable with respect to temperatures in the range for said heat treating.

3. The method of claim 1 or 2, said refractory metal silicide comprising two refractory metal silicides.

4. The method of claim 1, comprising forming a thin oxide layer between said electrode and said substrate.

5. The method of claim 1, said electrode being formed in direct contact with said semiconductor substrate.

6. The method of claim 5, comprising providing rectifying characteristics by performing alloying or sintering of said electrode with said semiconductor substrate.

7. The method of claim 1, comprising providing rectifying characteristics by providing an insulating film between said substrate and said electrode.

8. The method of claim 1, comprising etching about 100 Å away from said substrate on either side of said electrode prior to said heat treating.

9. The method of claim 1 or 2, comprising conducting said heat treating in a hydrogen atmosphere.

10. The method of claim 1 or 2, said compound semiconductor substrate being GaAs.

11. The method of claim 1 or 2, said refractory metal silicide including only one of Mo and W.

12. The method of claim 1 or 2, said silicide comprising two of said refractory metals.

13. The method of claim 2, said semiconductor substrate being GaAs.

14. The method of claim 13, said refractory metal silicide including silicide of Mo and W.

15. The method of claim 14, wherein said device is formed to have a breakdown voltage of a value that is higher than 5 volts, in correspondence to a surface impurity concentration of approximately $10^{17}$ cm$^{-3}$ and a peak impurity concentration of $10^{18}$ cm$^{-3}$.

16. A method for the manufacture of a semiconductor device comprising the steps of:
forming a Schottky gate electrode of refractory metal silicide containing tungsten, on a compound semiconductor substrate;
forming source and drain regions adjacent said Schottky gate electrode by ion-implanting an impurity into said compound semiconductor substrate using said Schottky gate electrode as a mask;
heat treating said compound semiconductor substrate by heating said compound semiconductor substrate to a temperature in the range from substantially 650° C. to substantially 850° C. to activate the introduced impurity; and
forming an electrode of a predetermined material on each of said source and drain regions, the ion-implantation being performed so that said source and drain regions have impurity concentration profiles in which the impurity concentrations are the highest at a predetermined depth from the surfaces of said source and drain regions and so that a short circuit does not occur between said source and drain regions and said Schottky gate electrode.

17. A method for manufacturing a semiconductor device, comprising the steps of:
forming a Schottky gate electrode of refractory metal silicide containing tungsten, on a GaAs semiconductor substrate;
forming source and drain regions in the GaAs semiconductor substrate adjacent the Schottky gate electrode by introducing an impurity into the GaAs semiconductor substrate using the Schottky gate electrode as a mask; and
subsequently heat treating the GaAs semiconductor substrate and the Schottky gate electrode by heating the GaAs semiconductor substrate and the Schottky gate electrode to a temperature in the range from substantially 650° C. to substantially 850° C. to activate the introduced impurity.

18. A method as set forth in claim 17, wherein said refractory metal silicide containing tungsten is tungsten silicide.

19. A method for the manufacture of a semiconductor device, comprising the steps of:
forming a Schottky gate electrode of a refractory metal silicide including Ta on a compound semiconductor substrate, the Schottky gate electrode having a barrier height and an ideality factor which are stable with respect to heat treatment at temperatures up to substantially 800° C.;
forming regions by introducing an impurity into the compound semiconductor substrate using the Schottky gate electrode as a mask; and
subsequently heat treating the semiconductor substrate and the Schottky gate electrode by heating the semiconductor substrate and the Schottky gate electrode to a temperature in the range from substantially 650° C. to substantially 800° C.

20. A method for manufacturing a semiconductor device comprising the steps of:
forming a Schottky gate electrode of refractory metal silicide including Ta on a compound semiconductor substrate;
introducing an impurity into the compound semiconductor substrate by an ion implantation using the Schottky gate electrode as a mask; and
subsequently heat treating said substrate and said electrode by heating said substrate and said electrode to a temperature in the range from substantially 650° C. to substantially 800° C.;
wherein said device is formed to have characteristics corresponding to at least one of a barrier height and an ideality factor with respect to said Schottky gate electrode that is stable with respect to said heat treating.

21. A method for the manufacture of a semiconductor device, comprising the steps of:
forming a Schottky gate electrode of a refractory metal silicide containing Ta on a compound semiconductor substrate;
forming source and drain regions adjacent said Schottky gate electrode by ion implanting an impurity into said compound semiconductor substrate using said Schottky gate electrode as a mask;
heat treating said compound semiconductor substrate by heating said compound semiconductor substrate to a temperature in the range from substantially 650° C. to substantially 800° C. to activate the introduced impurity; and
forming an electrode of a predetermined material on each of said source and drain regions, the ion implantation being performed so that said source and drain regions have impurity concentration profiles in which the impurity concentrations are the highest at a predetermined depth from the surfaces of said source and drain regions and so that a short circuit does not occur between said source and drain regions and said Schottky gate electrode.

* * * * *

UNITED STATES PATENT AND TRADEMARK OFFICE
CERTIFICATE OF CORRECTION

PATENT NO. : 5,200,349
DATED : APRIL 6, 1993
INVENTOR(S) : NAOKI YOKOYAMA

Page 1 of 3

It is certified that error appears in the above-identified patent and that said Letters Patent is hereby corrected as shown below:

TITLE PAGE [54] line 2, "SCHOTKY" should be --SCHOTTKY--;

TITLE PAGE [56] References Cited, line 1, "3,906,470" should be --3,906,540--;

TITLE PAGE [56] FOREIGN PATENT DOCUMENTS before line 1, insert the following:

| | | | |
|---|---|---|---|
| --0009914 | 3/1974 | Japan | |
| 0005965 | 1/1976 | Japan | 357/15--; |

UNITED STATES PATENT AND TRADEMARK OFFICE
CERTIFICATE OF CORRECTION

PATENT NO. : 5,200,349
DATED : APRIL 6, 1993
INVENTOR(S) : NAOKI YOKOYAMA

It is certified that error appears in the above-indentified patent and that said Letters Patent is hereby corrected as shown below:

TITLE PAGE, Col. 2, OTHER PUBLICATIONS line 5, "VCSI Applications" should be --VLSI Applications,--;
line 6, "2983," should be --1983,--;
line 9, "Sze, C.M." should be --Sze, S.M.--;
line 18, "Huatek, E.R," should be --Hnatek, E.R.,--;

after line 21, insert the following:

--Ohnishi, T., et al., Appl. Phys. Lett. 43(6) Sept. 15, 1983, pps. 600-602

UNITED STATES PATENT AND TRADEMARK OFFICE
CERTIFICATE OF CORRECTION

PATENT NO. : 5,200,349
DATED : APRIL 6, 1993
INVENTOR(S) : NAOKI YOKOYAMA

It is certified that error appears in the above-indentified patent and that said Letters Patent is hereby corrected as shown below:

Col. 1, line 2, "SCHOTKY" should be --SCHOTTKY--.

Col. 4, line 12, "material 50" should be --material so--.

Col. 5, line 68, "electrode" should be --electrodes--;

Between cols. 5 and 6, in the table, line 2, under Section 800°C.,

"1.68 ± 0.10" should be --1.69 ± 0.10--;

Col. 6, line 3, "well" should be deleted;
line 11, "of source" should be --of the source--;
line 36, "In present" should be --In the present--.

Signed and Sealed this

Eighteenth Day of April, 1995

Attest:

BRUCE LEHMAN

Attesting Officer

Commissioner of Patents and Trademarks